United States Patent
Maeda et al.

(10) Patent No.: US 8,328,928 B2
(45) Date of Patent: Dec. 11, 2012

(54) METAL NANOINK AND PROCESS FOR PRODUCING THE METAL NANOINK, AND DIE BONDING METHOD AND DIE BONDING APPARATUS USING THE METAL NANOINK

(75) Inventors: Toru Maeda, Tokyo (JP); Tetsuro Tanikawa, Tokyo (JP); Akinobu Teramoto, Miyagi (JP); Masaaki Oda, Chiba (JP)

(73) Assignees: Shinkawa Ltd., Tokyo (JP); Tohoku University, Miyagi (JP); Ulvac, Inc., Kanagawa (JP)

( * ) Notice: Subject to any disclaimer, the term of this patent is extended or adjusted under 35 U.S.C. 154(b) by 0 days.

(21) Appl. No.: 13/055,747

(22) PCT Filed: Jul. 8, 2009

(86) PCT No.: PCT/JP2009/062430
§ 371 (c)(1),
(2), (4) Date: Jan. 25, 2011

(87) PCT Pub. No.: WO2010/013588
PCT Pub. Date: Feb. 4, 2010

(65) Prior Publication Data
US 2011/0114708 A1 May 19, 2011

(30) Foreign Application Priority Data
Aug. 1, 2008 (JP) .................... 2008-200083

(51) Int. Cl.
C09D 11/00 (2006.01)
H01B 1/02 (2006.01)
(52) U.S. Cl. ............... 106/31.92; 106/31.13; 106/31.86; 252/500; 252/503; 228/248.1; 977/773; 977/777
(58) Field of Classification Search ............... 228/248.1; 106/31, 92, 31.13, 31.86; 977/777, 773, 977/775; 252/500, 503
See application file for complete search history.

(56) References Cited

U.S. PATENT DOCUMENTS
7,255,332 B2 * 8/2007 Osborn et al. .................. 261/28
(Continued)

FOREIGN PATENT DOCUMENTS
CN 1849260 A 10/2006
(Continued)

OTHER PUBLICATIONS
International Preliminary Report on Patentability dated Apr. 21, 2011, from corresponding International Application No. PCT/JP2009/062430.
(Continued)

Primary Examiner — Devang R Patel
(74) Attorney, Agent, or Firm — Katten Muchin Rosenman LLP

(57) ABSTRACT

Metal nanoink (100) for bonding an electrode of a semiconductor die and an electrode of a substrate and/or bonding an electrode of a semiconductor die and an electrode of another semiconductor die by sintering under pressure is produced by injecting oxygen into an organic solvent (105) in the form of oxygen nanobubbles (125) or oxygen bubbles (121) either before or after metal nanoparticles (101) whose surfaces are coated with a dispersant (102) are mixed into the organic solvent (105). Bumps are formed on the electrode of the semiconductor die and the electrode of the substrate by ejecting microdroplets of the metal nanoink (100) onto the electrodes, the semiconductor die is turned upside down and overlapped in alignment over the substrate, and then, the metal nanoparticles of the bumps are sintered under pressure by pressing and heating the bumps between the electrodes. As a result, generation of voids during sintering under pressure is minimized.

22 Claims, 10 Drawing Sheets

U.S. PATENT DOCUMENTS

| | | | |
|---|---|---|---|
| 7,704,866 B2 * | 4/2010 | Vanheusden et al. | 438/533 |
| 2007/0098883 A1 | 5/2007 | Itoh et al. | |
| 2007/0134491 A1 | 6/2007 | Atsuki et al. | |
| 2007/0244220 A1 * | 10/2007 | Kim et al. | 523/160 |
| 2007/0267334 A1 | 11/2007 | Osborn et al. | |
| 2008/0182011 A1 * | 7/2008 | Ng et al. | 427/99.4 |
| 2009/0039507 A1 | 2/2009 | Funaki | |
| 2009/0181172 A1 * | 7/2009 | Parpia et al. | 427/256 |
| 2010/0089980 A1 | 4/2010 | Maeda | |
| 2010/0093131 A1 | 4/2010 | Maeda | |

FOREIGN PATENT DOCUMENTS

| | | |
|---|---|---|
| JP | 9326416 A | 12/1997 |
| JP | 2002299833 | 10/2002 |
| JP | 2004327908 A | 11/2004 |
| JP | 2007177103 A | 7/2007 |
| JP | 2008218474 A | 9/2008 |
| WO | 2005025787 A1 | 3/2005 |
| WO | 2007/122925 | 11/2007 |

OTHER PUBLICATIONS

German Office Action dated Apr. 1, 2011, from corresponding German Application No. 11 2009 001 706.1-33.

International Search Report and Written Opinion dated Oct. 13, 2009 from the corresponding PCT/JP2009/062430.

Notice of Grounds for Rejection, mailed on Oct. 6, 2009, from the corresponding JP 2008-200083.

Chinese Office Action dated Aug. 14, 2012, from corresponding Chinese Application No. 200980130051.3.

* cited by examiner

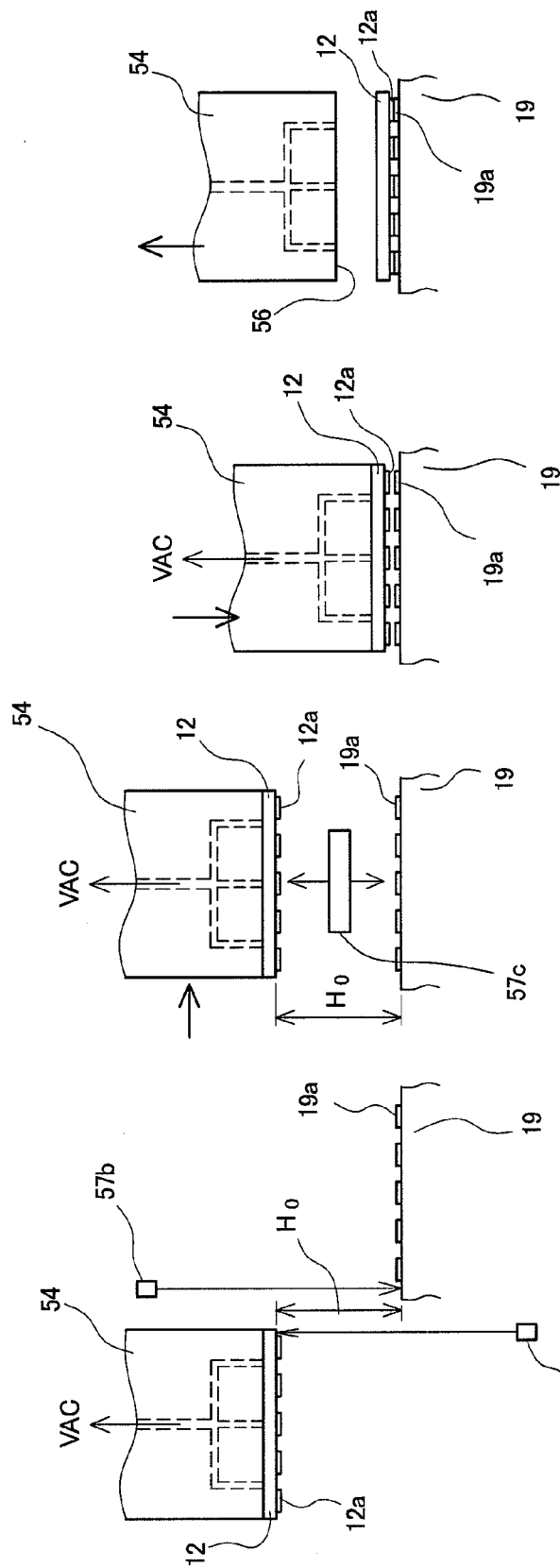

METAL NANOINK AND PROCESS FOR PRODUCING THE METAL NANOINK, AND DIE BONDING METHOD AND DIE BONDING APPARATUS USING THE METAL NANOINK

TECHNICAL FIELD

The present invention relates to metal nanoink for bonding an electrode of a semiconductor die and an electrode of a substrate and/or bonding an electrode of a semiconductor die and an electrode of another semiconductor die, and to a process for producing the metal nanoink, and a die bonding method and a die bonding apparatus using the metal nanoink.

BACKGROUND ART

To bond an electrode of an electronic component such as a semiconductor die and an electrode of a circuit pattern formed on a circuit substrate, there have been used methods in which a solder bump is formed on an electrode pad of an electronic component such as a semiconductor die, the formed solder bump is placed downward to face the electrode of the circuit substrate, and they are bonded by heating (see, for example, Patent Document 1). However, when solder is used in an attempt to bond electronic components in a multi-layered manner as in a conventional technique described in Patent Document 1, heat applied during bonding may cause melting of a bonded metal formed earlier, resulting in reduced reliability of bonding. For this reason, various methods using metal nanopaste including metal supermicroparticles have been proposed as methods for bonding electrodes without using a solder bump.

Patent Document 1 proposes a method in which a ball of silver microparticle paste prepared by dispersing silver super-micropowder in a solvent is formed on a terminal electrode of a circuit substrate, an electrode of a semiconductor device is bonded by the face-down technique on the ball formed on the terminal electrode of the circuit substrate, and then, after the solvent such as toluene contained in the silver microparticle paste is vaporized, the semiconductor device and the circuit substrate are electrically bonded by sintering at a temperature of 100 to 250° C.

Patent Document 2 relates to a metal nanoparticle liquid dispersion which is capable of forming a coating layer layered such that it has a cylindrical shape having a circular base in which the height is approximately equal to or greater than the radius of the base, by ejecting the metal nanoparticle liquid dispersion by means of inkjet or other methods, and subsequently preparing a sintered column of metal by low-temperature sintering, and proposes a metal nanoparticle liquid dispersion which, as a result of adjusting components of the solvent, has viscosity properties such that it has a low viscosity when the metal nanoparticle liquid dispersion is ejected in the form of microdroplets, it acquires a viscosity that enables the coating layer to be layered in the form of a column-shaped structure as the solvent evaporates during the time after the microdroplets are ejected until they reach an electrode surface, and, after reaching the electrode surface, it can be squeezed from between the metal nanoparticles during the low-temperature sintering. Patent Document 2 further proposes using this metal nanoparticle liquid dispersion to form a conductive wiring layer on a wiring substrate.

PRIOR ART DOCUMENTS

Patent Documents

Patent Document 1: JP 9-326416 A
Patent Document 2: WO 2005/025787

SUMMARY OF THE INVENTION

Problems to be Solved by the Invention

For cases where a metal layer is formed by sintering metal nanoink, metal nanopaste, or the like, portions other than metal formed with sintered metal nanoparticles are formed in the inside of the metal layer. Such portions are referred to as voids, and because they may increase electrical resistance or lower the strength of the metal layer, when metal nanoink or the like is sintered to form a metal layer, it is necessary to minimize generation of voids and minimize metal nanoparticles that remain unreacted as the dispersant is not removed.

An object of the present invention is to provide metal nanoink which can minimize generation of voids during sintering under pressure. Further, another object of the present invention is to provide a die bonding method and a die bonding apparatus which can minimize generation of voids.

Means for Solving the Problems

According to one aspect of the present invention, there is provided metal nanoink for bonding an electrode of a semiconductor die and an electrode of a substrate and/or bonding an electrode of a semiconductor die and an electrode of another semiconductor die by sintering under pressure, wherein the metal nanoink is prepared by mixing metal nanoparticles whose surfaces are coated with a dispersant and oxygen into an organic solvent. Further, it is also preferable that, in the metal nanoink of the present invention, the concentration of oxygen in the organic solvent is supersaturated.

According to another aspect of the present invention, there is provided a process for producing metal nanoink for bonding an electrode of a semiconductor die and an electrode of a substrate and/or bonding an electrode of a semiconductor die and an electrode of another semiconductor die by sintering under pressure, the process comprising a metal nanoparticle mixing step of mixing into an organic solvent metal nanoparticles whose surfaces are coated with a dispersant; and an oxygen injection step of injecting oxygen into the organic solvent. Further, it is also preferable that, in the process for producing metal nanoink of the present invention, the oxygen injection step comprises injecting oxygen into the organic solvent in the form of nanobubbles. Further, the oxygen injection step may be performed after the metal nanoparticle mixing step, and the oxygen injection step may be performed before the metal nanoparticle mixing step.

According to still another aspect of the present invention, there is provided a die bonding method comprising an overlapping step of placing a semiconductor die on which a bump is formed on an electrode by ejecting microdroplets of metal nanoink in which metal nanoparticles whose surfaces are coated with a dispersant and oxygen in the form of nanobubbles are mixed into an organic solvent, face down over a substrate on which a bump is formed on an electrode by ejecting microdroplets of the metal nanoink and/or another semiconductor die on which a bump is formed on an electrode by ejecting microdroplets of the metal nanoink, and overlapping the electrode of the semiconductor die and the electrode of the substrate and/or the electrode of the semiconductor die and the electrode of the other semiconductor die with the bumps interposed therebetween; and a pressure sintering step of sintering the metal nanoparticles of the bumps under pressure by pressing and heating the bumps between the electrodes to electrically bond the electrodes, wherein the electrode of the semiconductor die and the electrode of the substrate and/or the electrode of the semiconductor die and the electrode of the other semiconductor die are bonded.

According to still another aspect of the present invention, there is provided a die bonding apparatus comprising an ejection head for ejecting microdroplets of metal nanoink in which metal nanoparticles whose surfaces are coated with a dispersant and oxygen in the form of nanobubbles are mixed into an organic solvent to form a bump on an electrode; an overlapping mechanism for placing a semiconductor die on which the bump is formed, face down over a substrate on which a bump is formed on an electrode by ejecting microdroplets of the metal nanoink and/or another semiconductor die on which a bump is formed on an electrode by ejecting microdroplets of the metal nanoink, and overlapping the electrode of the semiconductor die and the electrode of the substrate and/or the electrode of the semiconductor die and the electrode of the other semiconductor die with the bumps interposed therebetween; and a pressing and heating mechanism for pressing and heating the bumps between the electrodes for sintering the metal nanoparticles of the bumps under pressure to electrically bond the electrodes, wherein the electrode of the semiconductor die and the electrode of the substrate and/or the electrode of the semiconductor die and the electrode of the other semiconductor die are bonded.

Advantages of the Invention

The metal nanoink according to the present invention provides an advantage in that generation of voids during sintering under pressure can be minimized. Further, the die bonding method and the die bonding apparatus according to the present invention provide an advantage in that generation of voids can be minimized.

BRIEF DESCRIPTION OF THE DRAWINGS

FIG. 6A is a schematic diagram showing overlapping of a semiconductor die onto a substrate for performing die bonding using metal nanoink according to the embodiment of the present invention.

FIG. 6B is a schematic diagram showing overlapping of the semiconductor die onto the substrate for performing die bonding using metal nanoink according to the embodiment of the present invention.

FIG. 6C is a schematic diagram showing overlapping of the semiconductor die onto the substrate for performing die bonding using metal nanoink according to the embodiment of the present invention.

FIG. 6D is a schematic diagram showing overlapping of the semiconductor die onto the substrate for performing die bonding using metal nanoink according to the embodiment of the present invention.

EMBODIMENTS FOR CARRYING OUT THE INVENTION

Figure 1:
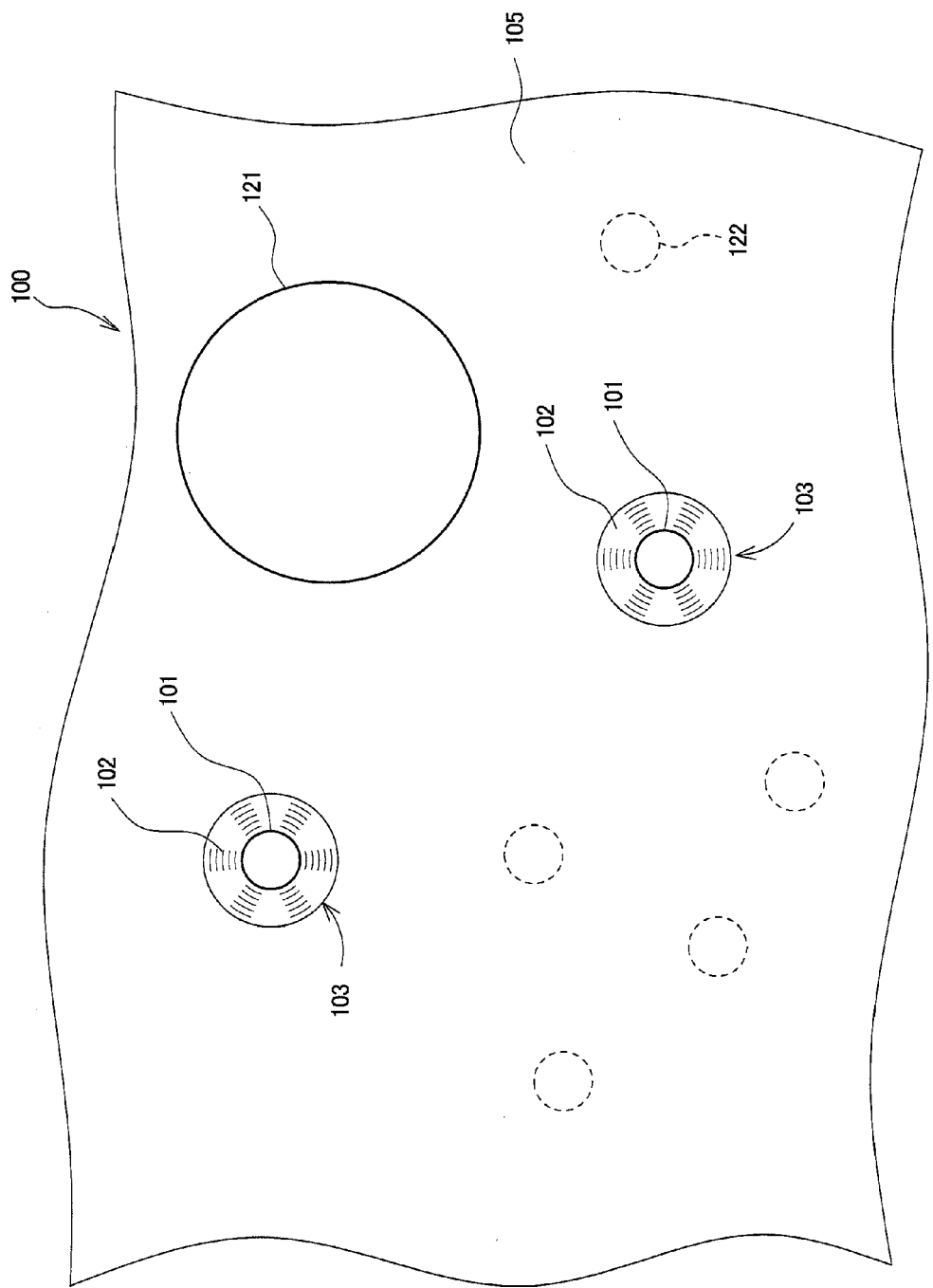
FIG. 1 is a schematic diagram showing metal nanoink according to an embodiment of the present invention.

A preferred embodiment of the present invention will be described below with reference to the drawings. As shown in FIG. 1, metal nanoink 100 according to the present embodiment includes an organic solvent 105, coated metal nanoparticles 103 each of which comprises a metal nanoparticle 101 composed of finely divided conductive metal and a dispersant 102 that is coated on surfaces of the metal nanoparticle 101 so that the respective metal nanoparticles 101 do not contact each other and a dispersed state can be maintained, and which are mixed into the organic solvent 105, oxygen bubbles 121 mixed into the organic solvent 105, and dissolved oxygen 122 dissolved in the organic solvent 105. The size of the metal nanoparticles 101 is approximately 5 to 50 nm in diameter. For the finely divided conductive metal that forms the metal nanoparticles 101, gold, silver, copper, platinum, palladium, nickel, aluminum, or the like may be used. For the dispersant 102 that is coated on surfaces of the metal nanoparticles 101, an alkylamine, an alkanethiol, an alkanediol, or the like may be used. For the organic solvent 105 which is a liquid, there may be used a nonpolar solvent or a low polar solvent having a relatively high boiling point which will not easily evaporate around room temperature; for example, a dispersion solvent such as terpineol, mineral spirit, xylene, toluene, tetradecane, or dodecane which contains therein a thermosetting resin component serving as an organic binder. The size of the coated metal nanoparticles 103 whose surfaces are coated with the dispersant 102 is, for example, approximately 100 nm in diameter, and is larger than the particle size of the metal nanoparticles 101.

Figure 2:
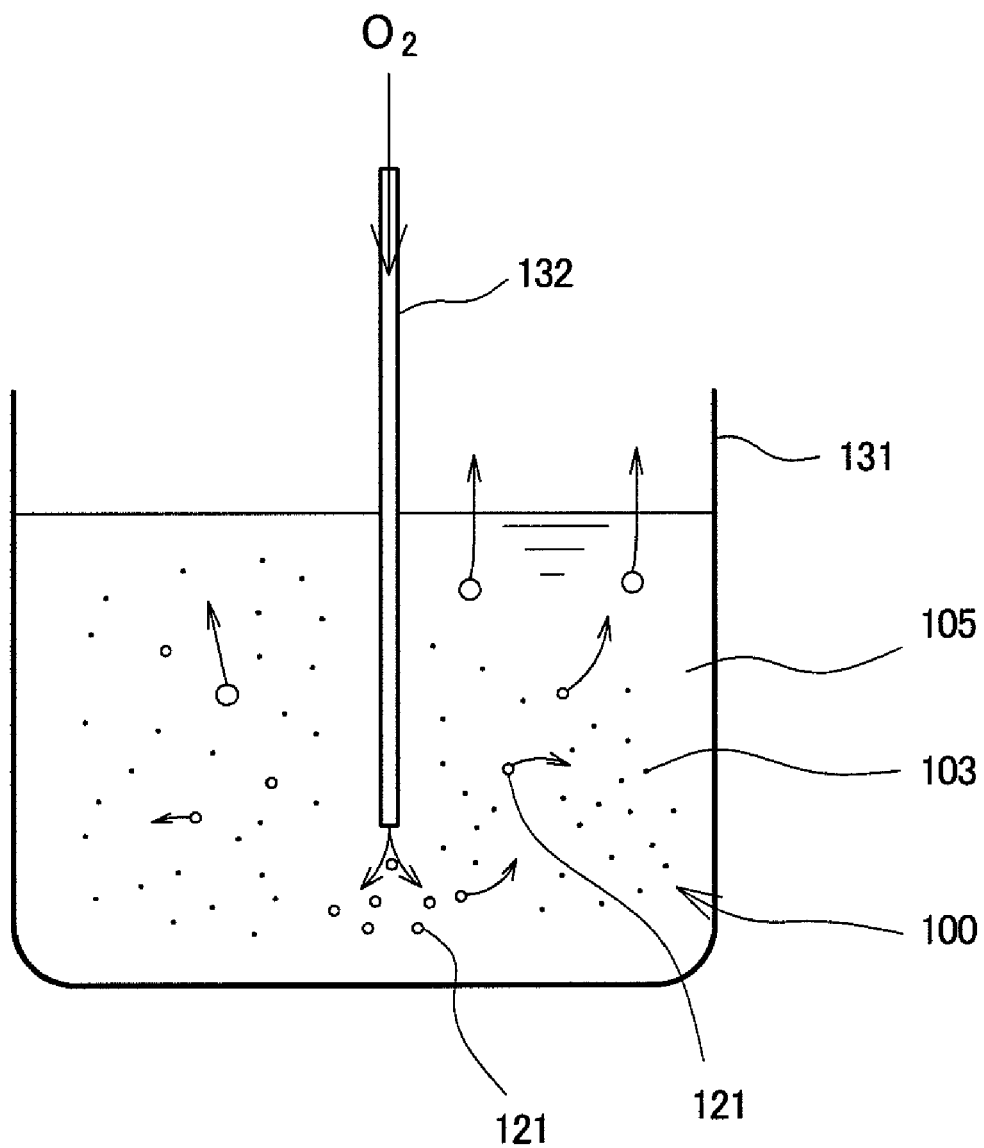
FIG. 2 is a schematic diagram showing a process for producing metal nanoink according to an embodiment of the present invention.

The metal nanoink 100 as described above is produced in the following manner. First, coated metal nanoparticles 103 in which a dispersant 102 is coated on surfaces of metal nanoparticles 101 composed of finely divided conductive metal are prepared, and a predetermined amount of the coated metal nanoparticles 103 are mixed into an organic solvent 105. Subsequently, the viscosity is adjusted, and metal nanoink 100 having no oxygen bubble 121 mixed therein is obtained. Next, as shown in FIG. 2, the metal nanoink 100 having no oxygen bubble 121 mixed therein is put into a container 131, and oxygen is injected into the metal nanoink 100 through an oxygen injection nozzle 132 which is inserted into the metal nanoink 100 from the liquid surface. Some of the injected oxygen is dissolved in the organic solvent 105 to form dissolved oxygen 122, but a large amount of oxygen forms bubbles and is dispersed in the organic solvent 105. As large bubbles go up to the liquid surface to be discharged to the atmosphere, and as only small bubbles are left in the organic solvent 105 to form oxygen bubbles 121, there can be produced metal nanoink 100 in which the coated metal nanoparticles 103, the oxygen bubbles 121, and the dissolved oxygen 122 are contained in the organic solvent 105. By injecting oxygen for a predetermined period of time such as, for example, ten hours, metal nanoink 100 having an appropriate amount of oxygen contained therein is obtained.

Figure 3:
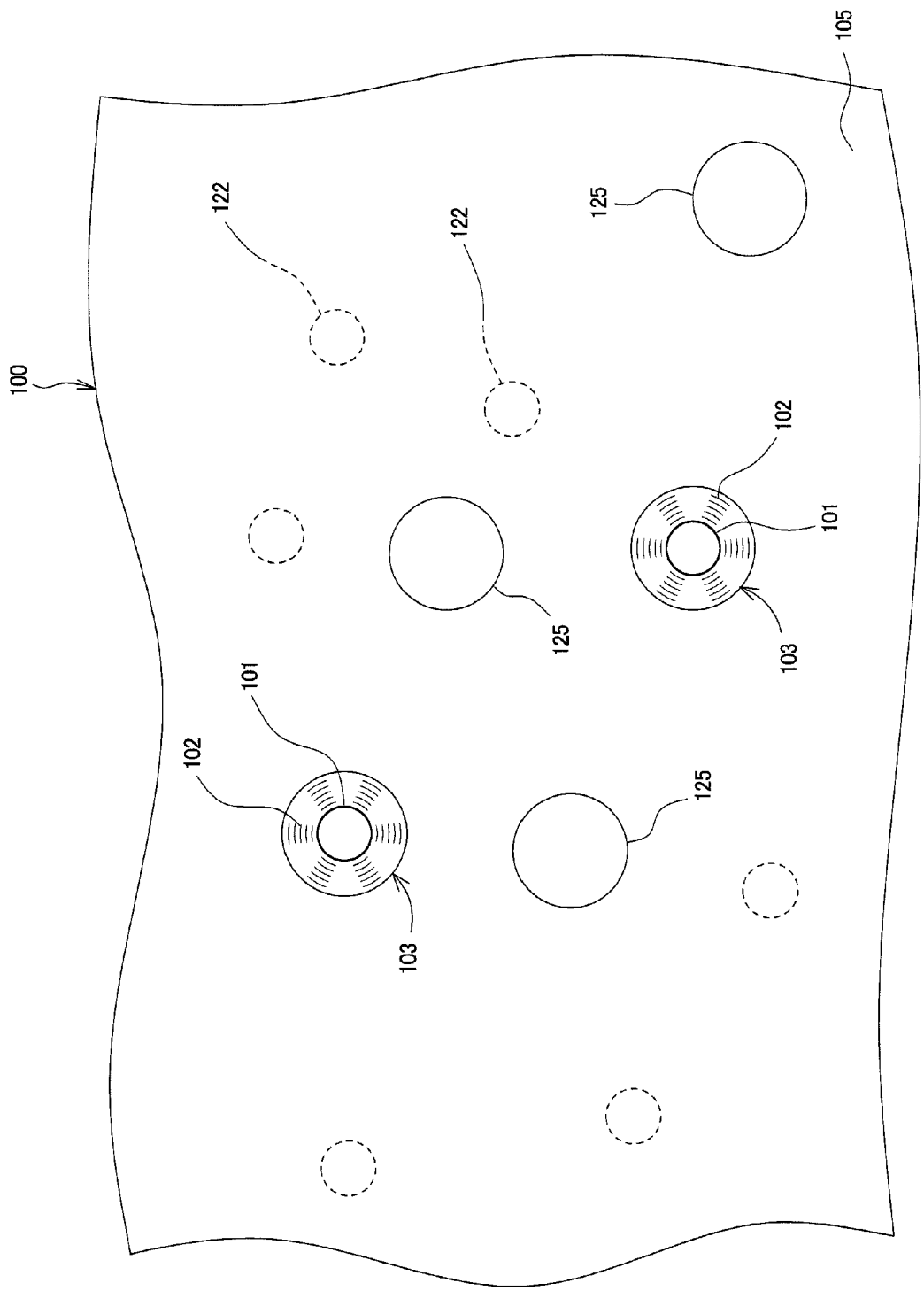
FIG. 3 is a schematic diagram showing metal nanoink according to another embodiment of the present invention.

As shown in FIG. 3, the metal nanoink 100 may contain oxygen nanobubbles 125, either instead of the oxygen bubbles 121 or in addition to the oxygen bubbles 121. The oxygen nanobubbles 125 are bubbles having a very small diameter similar to that of the coated metal nanoparticles 103. The metal nanoink 100 containing the oxygen nanobubbles 125 shown in FIG. 3 can be produced by causing oxygen nanobubbles 125 to be contained in an organic solvent 105 in a manner as shown in FIG. 4, and then, mixing into the organic solvent 105 a predetermined amount of coated metal nanoparticles 103 in which a dispersant 102 is coated on surfaces of metal nanoparticles 101 composed of finely divided conductive metal.

Figure 4:
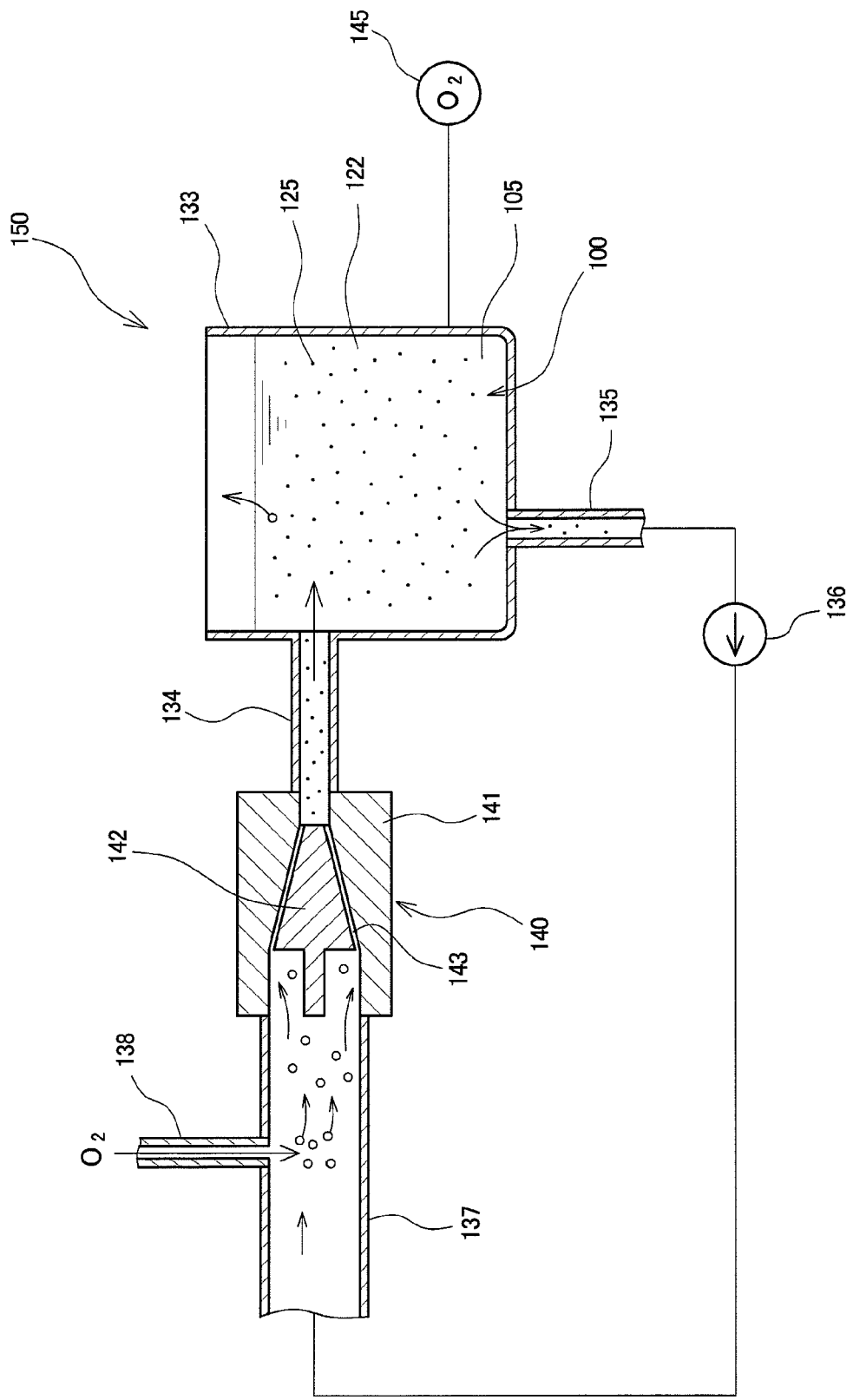
FIG. 4 is a schematic diagram showing a method for injecting oxygen nanobubbles into an organic solvent in a process for producing metal nanoink according to another embodiment of the present invention.

As shown in FIG. 4, an oxygen injection apparatus 150 includes a tank 133 which stores an organic solvent 105, a circulation pump 136 which circulates the organic solvent 105, an intake pipe 135 which connects between the tank 133 and the circulation pump 136, a discharge pipe 137 for the circulation pump 136, an oxygen injection nozzle 138 provided for the discharge pipe 137, an injector 140 provided between the oxygen injection nozzle 138 and the tank 133 for shearing oxygen bubbles injected through the oxygen injection nozzle 138 to form oxygen nanobubbles 125 of approximately 100 nm diameter, and a pipe 134 which connects between the injector 140 and the tank 133. Further, an oxygen concentration sensor 145 for detecting the concentration of oxygen in the organic solvent 105 stored in the tank 133 is attached to the tank 133.

The organic solvent 105 stored in the tank 133 is drawn in through the intake pipe 135 to the circulation pump 136, and is pressurized and discharged to the discharge pipe 137. Oxygen in the form of bubbles is injected through the oxygen injection nozzle 138 into the organic solvent 105 discharged to the discharge pipe 137. Some of the injected oxygen is dissolved in the organic solvent 105 to form dissolved oxygen 122. Oxygen which is not dissolved flows into the injector 140 in the form of large bubbles. The injector 140 is composed of a nozzle 141 having a tapered hole that narrows toward an end, and a core 142 which is provided within the nozzle 141, wherein the organic solvent 105 including oxygen bubbles flows at high rate in a gap 143 having a conical tubular surface which is formed between the nozzle 141 and the core 142, and a shear force generated between the wetted surface of the gap 143 and the bubbles transforms the bubbles into very small oxygen nanobubbles 125. The organic solvent 105 that has flowed from the injector 140 through the pipe 134 to the tank 133 includes dissolved oxygen 122, oxygen nanobubbles 125, and oxygen bubbles having a larger size. Large oxygen bubbles go up toward the liquid surface of the organic solvent 105 in the tank 133, and escape from the liquid surface to the atmosphere. The oxygen nanobubbles 125 remain in the organic solvent 105. Oxygen bubbles which are larger than the oxygen nanobubbles 125 but which are unable to escape from the liquid surface of the organic solvent 105 in a short time are again drawn in to the intake pipe 135 together with the organic solvent 105, and the injector 140 transforms some of them into oxygen nanobubbles 125. After a predetermined time of circulation through the circulation pipe channel including the injector 140, the organic solvent 105 including the oxygen nanobubbles 125 and the dissolved oxygen 122 can be obtained. During this process, the amount of oxygen to be injected through the oxygen injection nozzle 138 can be adjusted as desired based on the concentration of oxygen in the organic solvent 105 which is detected by the oxygen concentration sensor 145 attached to the tank 133.

The oxygen nanobubbles 125 included in the organic solvent 105 produced in the above-described manner can continue to remain in the organic solvent 105 even after the passage of time, because they have a very small diameter. Further, by mixing oxygen into the organic solvent 105 in the form of oxygen nanobubbles 125, the concentration of oxygen in the organic solvent 105 can be supersaturated to a concentration greater than the saturation concentration, and a large amount of oxygen can be contained in the organic solvent 105.

The above-described method is particularly useful in cases where mixing the coated metal nanoparticles 103 into the organic solvent 105 increases the viscosity and makes it impossible to mix oxygen nanobubbles into the metal nanoink 100 by means of the injector 140, because the coated metal nanoparticles 103 are mixed into the organic solvent 105 after the oxygen nanobubbles 125 are mixed by passing a low-viscosity organic solvent 105 through the injector 140.

Next, a predetermined amount of the coated metal nanoparticles 103 in which the dispersant 102 is coated on surfaces of the metal nanoparticles 101 composed of finely divided conductive metal are mixed into the organic solvent 105 including the oxygen nanobubbles 125, to thereby produce the metal nanoink 100. Because the oxygen nanobubbles 125 have a very small particle size, most of them are not scattered and lost to the outside of the organic solvent 105 even during the mixing, and the metal nanoink 100 containing therein a large amount of oxygen can be produced. Further, by increasing the amount of the dispersant 102, or by adding a viscosity-adjusting component to the organic solvent 105, the metal nanoink 100 may have a viscosity conforming to the shape of an ejection head which will be described below.

A die bonding method for bonding an electrode 19a of a substrate 19 and an electrode 12a of a semiconductor die 12 using the metal nanoink 100 produced in the above-described manner will be described with reference to FIG. 5A to FIG. 9C.

The die bonding method is a die bonding method for bonding an electrode 12a of a semiconductor die 12 and an electrode 19a of a substrate 19, and/or an electrode 12a of a semiconductor die 12 and an electrode 12a of another semiconductor die 12, the method comprising overlapping the electrode 12a of the semiconductor die 12 and the electrode 19a of the substrate 19 and/or the electrode 12a of the semiconductor die 12 and the electrode 12a of the other semiconductor die 12 with bumps 200 interposed therebetween, while the semiconductor die 12 on which a bump 200 is formed on the electrode 12a or 19a by ejecting microdroplets 110 of metal nanoink 100 in which metal nanoparticles 101 whose surfaces are coated with a dispersant 102 and oxygen are mixed into an organic solvent 105 is being placed face down over the substrate 19 on which a bump 200 is formed on the electrode 12a or 19a by ejecting microdroplets 110 of the metal nanoink 100 and/or the other semiconductor die 12 on which a bump 200 is formed on the electrode 12a or 19a by ejecting microdroplets 110 of the metal nanoink 100, and, then, sintering the metal nanoparticles 101 of the bumps 200 under pressure by pressing and heating the bumps 200 between the electrodes 12a and 19a to electrically bond the electrodes 12a and 19a. A detailed description will be provided below.

Figure 5B:
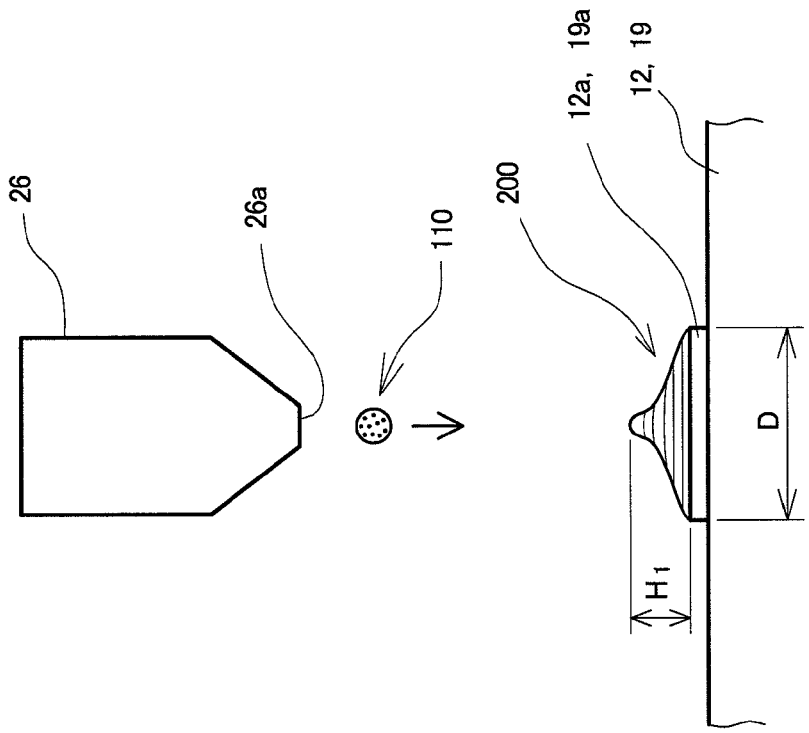
FIG. 5B is a schematic diagram showing formation of the bump for performing die bonding using metal nanoink according to the embodiment of the present invention.
Figure 5A:
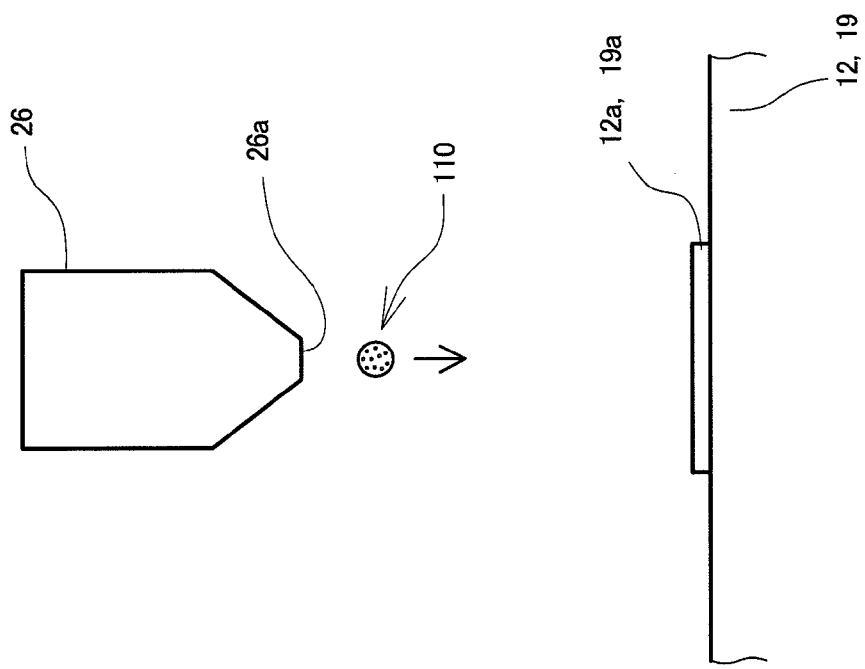
FIG. 5A is a schematic diagram showing formation of a bump for performing die bonding using metal nanoink according to an embodiment of the present invention.

As shown in FIG. 5A, by ejecting microdroplets 110 of the metal nanoink 100 from an ejection nozzle 26a of an ejection head 26 toward an electrode 12a of a semiconductor die 12 a plurality of times, a bump 200 is formed on the electrode 12a.

As shown in FIG. 5B, a microdroplet 110 of the metal nanoink 100 that is first ejected from the ejection nozzle 26a of the ejection head 26 onto the electrode 12a spreads out on the electrode 12a in the form of a thin layer. A subsequent microdroplet 110 of the metal nanoink 100 is deposited on the layer of the metal nanoink 100 that has spread out on the electrode 12a, and therefore, spreads out over a smaller area than the first microdroplet 110 which is deposited directly on the surface of the electrode 12a, so that a slight projection is formed on the surface of the electrode 12a. A further subsequent microdroplet 110 of the metal nanoink 100 spreads out over a further smaller area than the previous two microdroplets 110, so that the projection gradually becomes greater in size. As described above, as a result of sequentially ejecting microdroplets 110 of the metal nanoink 100 onto the electrode 12a, the projection gradually becomes greater, and, as shown in FIG. 5B, a conical bump 200 having a steeper inclination as it approaches the top is formed through several ejection operations. The bump 200 has a height $H_1$ as measured from the electrode 12a. For the ejection head 26, by using an ejection head as used for inkjet techniques, it is possible to eject a large number of microdroplets 110 to form layers in a short time. When ejections are performed using an inkjet head, the viscosity of the metal nanoink 100 is adjusted to be low. Further, when the viscosity is high, or when metal nanoink 100 including oxygen bubbles 121 that are larger than oxygen nanobubbles 125 is used, in order to avoid cavitation in the ejection head 26, droplets may be provided onto the electrode 12a using, for example, a dispenser to form the bump 200.

A bump 200 is also formed on the electrode 19a of the substrate 19 using a method similar to that used for forming a bump 200 on the electrode 12a.

After the bumps 200 are respectively formed on the electrode 12a of the semiconductor die 12 and the electrode 19a of the substrate 19, as shown in FIG. 6A, the semiconductor die 12 is turned upside down to be held by means of suction by a collet 54, and the height of the surface of the semiconductor die 12 is detected by a height sensor 57a. Also, the height position of the surface of the substrate 19 which is fixed on a bonding stage by vacuum suction is detected by a height sensor 57b. Further, an interval $H_0$ between the surface of the semiconductor die 12 and the surface of the substrate 19 is calculated based on data representing the distance between the height sensor 57a and the semiconductor die 12 and data representing the distance between the height sensor 57b and the substrate 19 which are obtained by means of the sensors 57a and 57b.

As shown in FIG. 6B, the collet 54 is moved to cause the position of the bump 200 formed on the electrode 12a of the semiconductor die 12 which is held by means of vacuum suction by the collet 54 to align with the position of the bump 200 formed on the electrode 19a of the substrate 19. Further, an upward and downward dual field of view camera 57c is moved to enter between the semiconductor die 12 and the substrate 19 to capture images of an alignment mark formed on the surface of the semiconductor die 12 and an alignment mark formed on the surface of the substrate 19, the positional deviation of the alignment marks with respect to the optical axis of the upward and downward dual field of view camera 57c is detected based on the captured images, and the collet 54 is moved by the amount of that deviation to thereby align the position of the electrode 12a of the semiconductor die 12 with the relative position of the electrode 19a of the substrate 19.

Figure 7B:
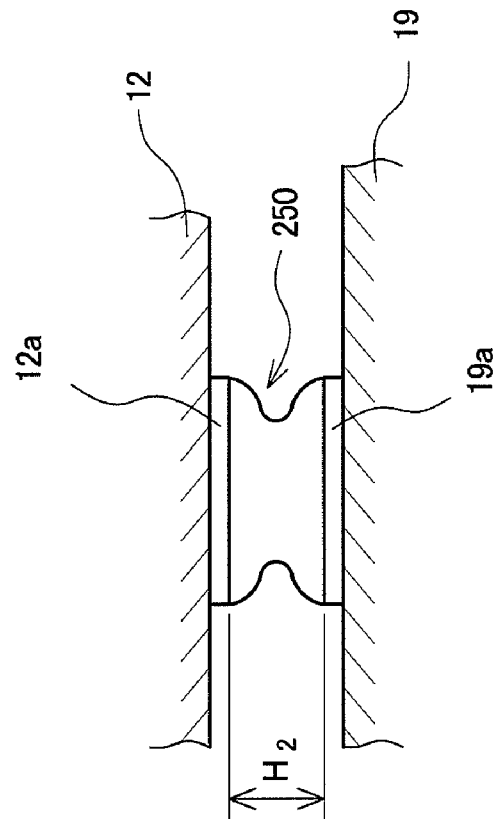
FIG. 7B is a schematic diagram showing formation of the bonded bump for performing die bonding using metal nanoink according to the embodiment of the present invention.
Figure 7A:
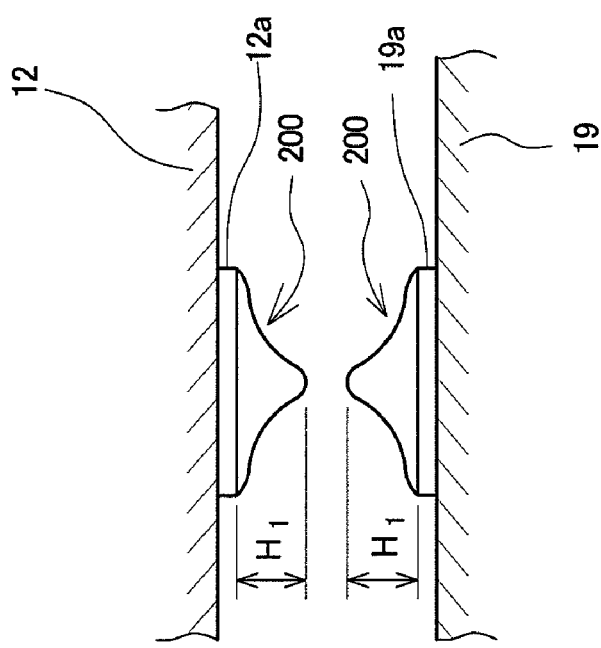
FIG. 7A is a schematic diagram showing formation of a bonded bump for performing die bonding using metal nanoink according to the embodiment of the present invention.

As shown in FIG. 6C and FIG. 7A, by means of the collet 54, the semiconductor die 12 is placed face down so that the electrode 12a of the semiconductor die 12 is located directly above the electrode 19a of the substrate 19 and the semiconductor die 12 is at a height such that the bumps 200 having the height $H_1$ formed on the electrodes 12a and 19a do not contact each other, and, subsequently, as shown in FIG. 6D, the vacuum of the collet 54 is released, and the electrode 12a of the semiconductor die 12 and the electrode 19a of the substrate 19 are overlapped with the bumps 200 interposed therebetween. Here, the collet 54 and a collet-moving apparatus for moving the collet 54, which is not shown, constitute an overlapping mechanism. As shown in FIG. 7B, the bumps 200 formed on the electrodes 12a and 19a, when overlapped, are combined into a bonded bump 250, resulting in a state in which the semiconductor die 12 is supported by the bonded bump 250. The bonded bump 250 has a height $H_2$ less than the sum height $2 \times H_1$ of the bumps 200 before they are overlapped. However, this height $H_2$ is greater than a height $H_3$ of a bonded metal 300, which will be described below.

Figure 8:
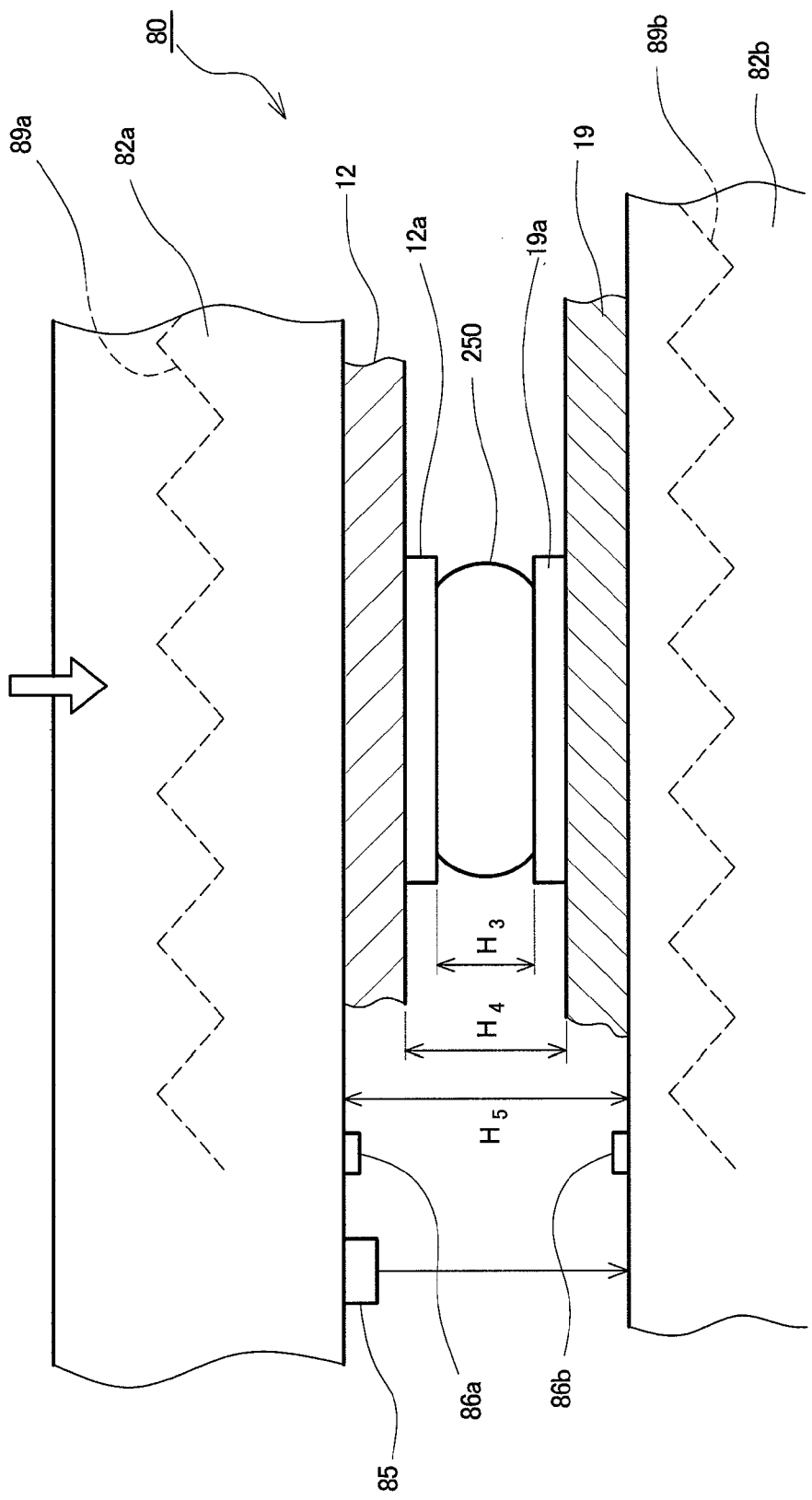
FIG. 8 is a schematic diagram showing a state in which a pressing and heating mechanism inserts and pinches the semiconductor die and the substrate for performing die bonding using metal nanoink according to the embodiment of the present invention.
Figure 9C:
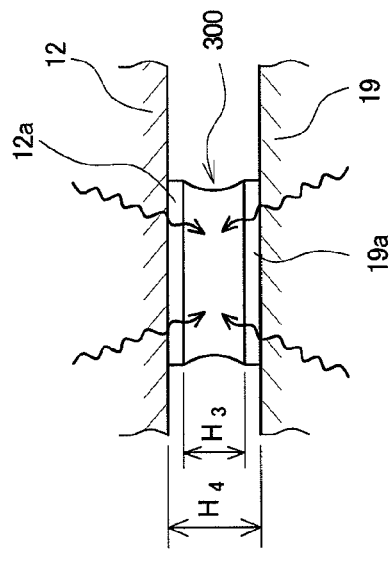
FIG. 9C is a schematic diagram showing pressure sintering of the electrodes of the semiconductor die and the substrate for performing die bonding using metal nanoink according to the embodiment of the present invention.
Figure 9B:
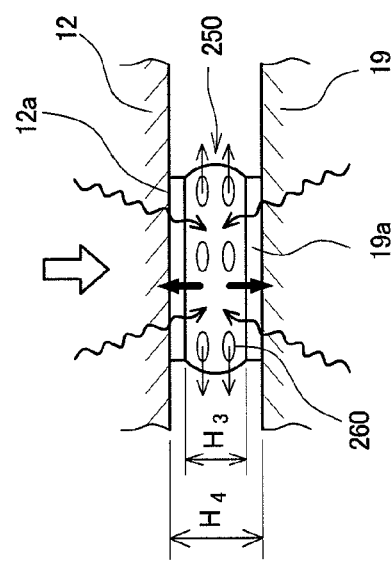
FIG. 9B is a schematic diagram showing pressure sintering of the electrodes of the semiconductor die and the substrate for performing die bonding using metal nanoink according to the embodiment of the present invention.
Figure 9A:
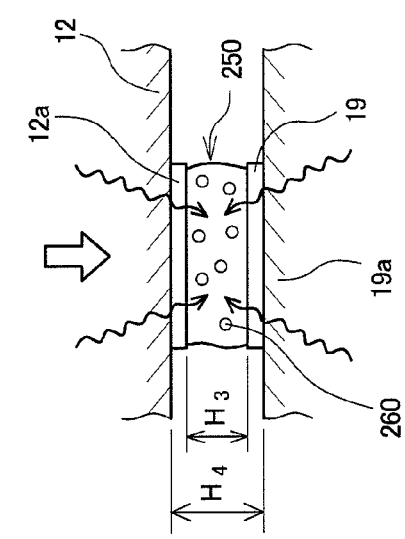
FIG. 9A is a schematic diagram showing pressure sintering of electrodes of the semiconductor die and the substrate for performing die bonding using metal nanoink according to the embodiment of the present invention.

After the electrode 12a of the semiconductor die 12 is overlapped on the electrode 19a of the substrate 19, the substrate 19 is transferred to a pressing and heating mechanism 80. As shown in FIG. 8, while the interval between an upper holding plate 82a and a lower holding plate 82b is being detected by a gap sensor 85, the pressing and heating mechanism 80 inserts and pinches the semiconductor die 12 and the substrate 19 in that gap, to cause the interval between the upper holding plate 82a and the lower holding plate 82b to become a predetermined interval $H_5$. Here, the predetermined interval $H_5$ is the sum of a predetermined height $H_3$ of a bonded metal 300 which is to be formed between the electrode 12a of the semiconductor die 12 and the electrode 19a of the substrate 19, the thicknesses of the electrodes 12a and 19a, the thickness of the semiconductor die 12, and the thickness of the substrate 19, as shown in FIG. 9A to FIG. 9C. The predetermined height $H_3$ of the bonded metal 300 as shown in FIG. 9A to FIG. 9C is preferably 10 μm to 15 μm. As the height $H_3$ is less than the height $H_2$ of the bonded bump 250 described above, upon completion of the insertion and pinching of the semiconductor die 12 and the substrate 19 between the upper holding plate 82a and the lower holding plate 82b of the pressing and heating mechanism 80, the bonded bump 250 is compressed by the amount of $H_2$—$H_3$ and, thus, the bonded bump 250 is pressed.

After completion of the insertion and pinching of the semiconductor die 12 and the substrate 19 between the upper holding plate 82a and the lower holding plate 82b, heaters 89a and 89b are turned on to start heating the bonded bump 250. The temperature of the upper holding plate 82a and the temperature of the lower holding plate 82b are detected by temperature sensors 86a and 86b, and the voltages to be applied to the heaters 89a and 89b are adjusted so that the temperature of the bonded bump 250 is in the range of 150° C. to 250° C. During the time the bonded bump 250 is heated by the heaters 89a and 89b, the interval between the electrodes 12a and 19a in the height direction is held to be the height $H_3$ by means of the upper holding plate 82a and the lower holding plate 82b.

As shown in FIG. 9A, heating the bonded bump 250 as represented by wavy-line arrows causes the dispersant 102, which is an organic compound, to be thermally decomposed and evaporate to bring the metal nanoparticles 101 into contact with each other. The metal nanoparticles 101, when brought into contact with each other, are welded to each other to form metal links at a temperature of approximately 150° C., which is lower than the welding temperature for ordinary metals. Further, the dispersant 102 or the organic solvent 105 remaining in gaps between the links created by bonding the metal nanoparticles 101 is squeezed to the outside of the links. Further, the dispersant 102 and the organic solvent 105 volatilize and evaporate from the surface of the bonded bump 250 to the atmosphere under the influence of heat, and, in addition, the carbon component contained therein bonds to the dissolved oxygen 122, the oxygen bubbles 121, and the oxygen nanobubbles 125 contained in the bonded bump 250 to form carbon dioxide. Gaseous carbon dioxide has a fluidity greater than that of the dispersant 102 and that of the organic solvent 105, which are in liquid state, and combines to form air bubbles 260 while moving through between the links of the metal nanoparticles 101 toward the outer periphery of the bonded bump 250. Although the air bubbles 260 of carbon dioxide expand by the application of heat and attempt to increase the interval between the electrodes 12a and 19a in the height direction, because the interval between the electrodes 12a and 19a in the height direction is restricted to the height $H_3$ by means of the upper holding plate 82a and the lower holding plate 82b, the amount of pressure increase acts as a pressing force for compressing the bonded bump 250 as represented by an outline arrow in FIG. 9A.

As shown in FIG. 9B, an internal pressure increase causes the bonded bump 250 to expand in the lateral direction, and causes the air bubbles 260 of carbon dioxide generated therein to gradually move in the lateral direction while being deformed to be laterally elongated, to thereby be discharged from the sides of the bonded bump 250 to the outside. Further, after pressure as represented by the outline arrow and heat as represented by the wavy-line arrows are applied for a predetermined period of time, as shown in FIG. 9C, the organic solvent 105 and the dispersant 102 volatilize or are discharged in the form of carbon dioxide, and the metal nanoparticles 101 of the bonded bump 250 are bonded to each other to form a bulk bonded metal 300, so that the electrodes 12a and 19a are electrically bonded.

Figure 10A:
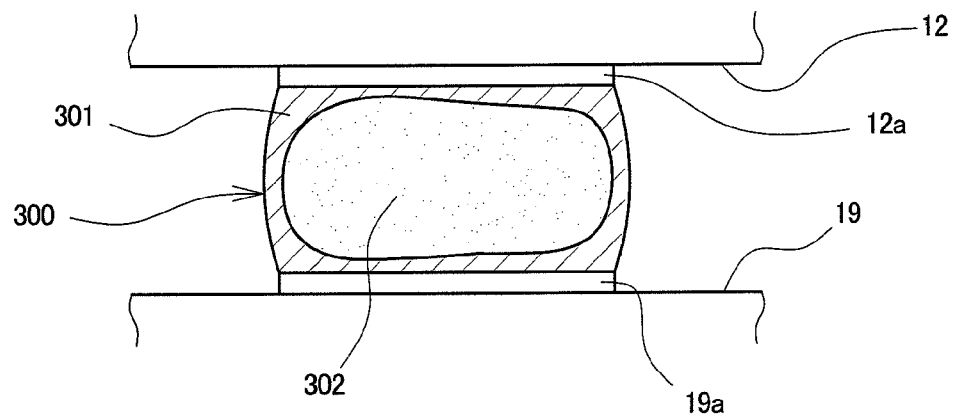
FIG. 10A is a schematic diagram showing a cross section of a bonded metal having been subjected to die bonding using metal nanoink according to a conventional technique.

As described above, the carbon component contained in the dispersant 102 or the organic solvent 105 bonds to oxygen during sintering to form carbon dioxide, and is discharged to the atmosphere. However, although the cylindrical surface on the outer periphery of the bonded bump 250 formed by the metal nanoink 100 is exposed to the atmosphere, because the top and bottom surfaces are in contact with the surfaces of the electrodes 12a and 19a, the amount of oxygen introduced from the surfaces into the inside of the bonded bump 250 is small, and, when oxygen is not contained inside in the form of, for example, the oxygen bubbles 121 or the oxygen nanobubbles 125, sufficient oxygen for causing the carbon to turn into carbon dioxide is not available in the inside of the bonded bump 250 into which oxygen cannot be easily introduced, resulting in a situation in which the carbon remains without turning into carbon dioxide. Therefore, as shown in FIG. 10A, although a dense bulk metal 301 is formed in an outer covering portion of the bonded metal 300 after it is sintered, substances other than metal, such as carbon, remain in the inside between the links created by bonding the metal nanoparticles 101 in the form of voids to form a porous structure portion 302. As the porous structure portion 302 has high electrical resistance and low mechanical strength, the bonding properties are degraded.

Figure 10B:
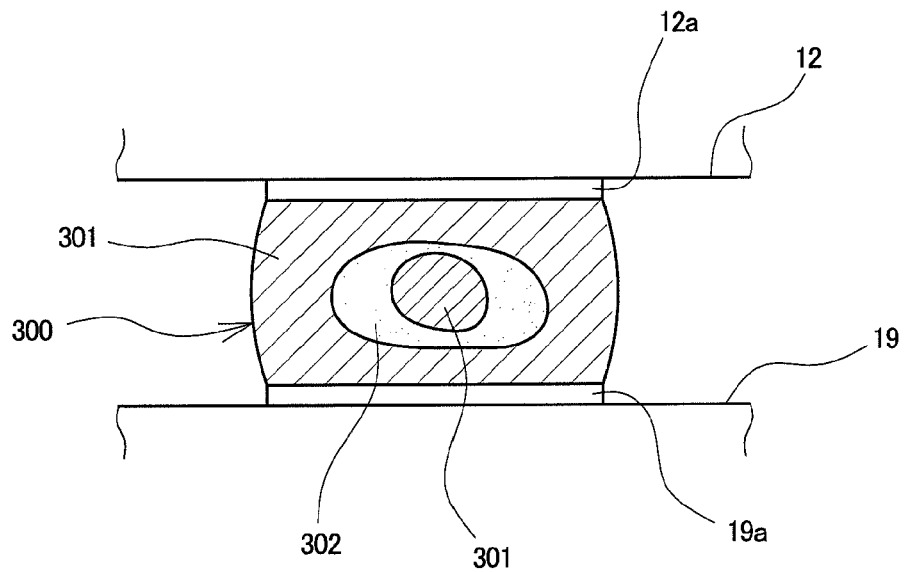
FIG. 10B is a schematic diagram showing a cross section of a bonded metal having been subjected to die bonding using metal nanoink according to the embodiment of the present invention.

As described above, by forming the bumps 200 using the metal nanoink 100 having oxygen contained therein in the form of, for example, the dissolved oxygen 122, the oxygen bubbles 121, and the oxygen nanobubbles 125 contained in the metal nanoink 100, and bonding them to form the bonded bump 250, because the bonded bump 250 contains a large amount of oxygen in the inside, the carbon contained in the dispersant 102 and the organic solvent 105 can be discharged to the outside in the form of carbon dioxide. Therefore, generation of voids during sintering under pressure can be minimized, and, as shown in FIG. 10B, the portion of the bulk metal 301 of the bonded metal 300 extends from the outer covering portion to the inside, and the portion of the bulk metal 301 is also formed in the inside. Further, the region of the porous structure portion 302 which includes voids is significantly reduced in comparison with the state shown in FIG. 10A, and the bonded metal 300 having low electrical resistance and high mechanical strength can be formed. Further, by performing bonding using the metal nanoink 100 having oxygen contained therein in the form of, for example, the dissolved oxygen 122, the oxygen bubbles 121, and the oxygen nanobubbles 125 contained in the metal nanoink 100, because metal nanoparticles that remain unreacted as the dispersant is not removed can be minimized, the portion of the bulk metal 301 can be increased.

It is desirable that the metal nanoink 100 contains therein as large an amount of oxygen as possible, and it is preferable that it contains therein an amount of oxygen greater than the saturation concentration of oxygen in the organic solvent 105. Experimental results indicate that, when the bumps 200 were formed on the electrode 12a of the semiconductor die 12 and the electrode 19a of the substrate 19 by providing the metal nanoink 100 including the oxygen bubbles 121 and the dissolved oxygen 122 produced by the method of blowing oxygen described with reference to FIG. 2 by means of a dispenser, the semiconductor die 12 was turned upside down to align the positions of the electrodes 12a and 19a with each other so that they were overlapped to form the bonded bump 250, and then, the pressing and heating mechanism 80 performed sintering under pressure, for a case where the oxygen injection time was short, approximately one hour, and the amount of oxygen contained in the metal nanoink 100 was small, the bonded metal 300 having been sintered under pressure included a large amount of the porous structure portion 302 as shown in FIG. 10A. In contrast, for a case where the oxygen injection time was long, approximately ten hours, and the amount of oxygen contained in the metal nanoink 100 was large, the bonded metal 300 having been sintered under pressure included a small amount of the porous structure portion 302 and a large amount of the bulk metal 301 as shown in FIG. 10B. Further, experimental results prove that the sintering properties are improved by containing oxygen of an amount five or more times the saturation concentration of oxygen in the organic solvent 105.

As described above, the metal nanoink 100 according to the present embodiment provides an advantage in that generation of voids during sintering under pressure can be minimized, and the bonded metal 300 having low electrical resistance and high mechanical strength can be formed.

For the above-described bonding method which uses the metal nanoink 100, although a case where the electrode 12a of the semiconductor die 12 is bonded to the electrode 19a of the substrate 19 is described, the electrode 12a of the semiconductor die 12 may be turned upside down and overlapped on an electrode 12a of another semiconductor die 12 to be bonded to each other. Further, the electrode 12a may be a through electrode which passes through the semiconductor die 12 in the thickness direction, and by overlapping the electrodes 12a with the bumps 200 interposed therebetween without turning the semiconductor die 12 upside down, and then performing sintering under pressure to connect between the through electrodes, the semiconductor dies 12 may be implemented in a multilayered manner.

The present invention is not limited to the above-described embodiments, but encompasses all changes and modifications which do not depart from the technical scope or essence of the present invention as defined in the claims.

REFERENCE NUMERALS

12 SEMICONDUCTOR DIE
12a, 19a ELECTRODE
19 SUBSTRATE
26 EJECTION HEAD
26a EJECTION NOZZLE
54 COLLET
57a, 57b HEIGHT SENSOR
57c UPWARD AND DOWNWARD DUAL FIELD OF VIEW CAMERA
80 PRESSING AND HEATING MECHANISM
82a UPPER HOLDING PLATE
82b LOWER HOLDING PLATE
85 GAP SENSOR
86a, 86b TEMPERATURE SENSOR
89a, 89b HEATER
100 METAL NANOINK
101 METAL NANOPARTICLE
102 DISPERSANT
103 COATED METAL NANOPARTICLE
105 ORGANIC SOLVENT
110 MICRODROPLET
121 OXYGEN BUBBLE
122 DISSOLVED OXYGEN
125 OXYGEN NANOBUBBLE
131 CONTAINER
132 OXYGEN INJECTION NOZZLE
133 TANK
134 PIPE
135 INTAKE PIPE
136 CIRCULATION PUMP
137 DISCHARGE PIPE
138 OXYGEN INJECTION NOZZLE
140 INJECTOR
141 NOZZLE
142 CORE
143 GAP
145 OXYGEN CONCENTRATION SENSOR
150 OXYGEN INJECTION APPARATUS
200 BUMP
250 BONDED BUMP
260 AIR BUBBLE
300 BONDED METAL
301 BULK METAL
302 POROUS STRUCTURE PORTION

The invention claimed is:

1. A metal nanoink comprising:
a dispersant comprising carbon;
a plurality of metal nanoparticles, each of the nanoparticles comprising a coating of the dispersant; and
an organic solvent comprising oxygen nanobubbles, the solvent comprising oxygen at a supersaturated concentration which is at least five times an oxygen saturation concentration in the organic solvent;
wherein oxygen is present only as dissolved oxygen and oxygen nanobubbles.

2. The metal nanoink of claim 1, wherein each of the metal nanoparticles comprises an uncoated diameter of 5 to 50 nm.

3. The metal nanoink of claim 2, wherein each of the metal nanoparticles comprises a coated diameter is substantially 100 nm.

4. The metal nanoink of claim 1, wherein the plurality of metal nanoparticles is selected from the group of gold, silver, copper, platinum, palladium, nickel, and aluminum.

5. The metal nanoink of claim 1, wherein the organic solvent may be a nonpolar solvent or a low polar solvent.

6. The metal nanoink of claim 1, wherein the organic solvent has a boiling point greater than room temperature.

7. The metal nanoink of claim 1, wherein the dispersant is selected from the group of an alkylamine, an alkanethiol, or an alkanediol.

8. The metal nanoink of claim 7, wherein the plurality of metal nanoparticles is selected from the group of gold, silver, copper, platinum, palladium, nickel, and aluminum.

9. The metal nanoink of claim 8, wherein the organic solvent is selected from the group of a terpineol, a mineral spirit, a xylene, a toluene, a tetradecane, or a dodecane solvent.

10. The metal nanoink of claim 9, further comprising an organic binder.

11. The metal nanoink of claim 1, wherein the oxygen nanobubbles comprise a diameter of substantially 100 nm.

12. A metal nanoink comprising:
a dispersant comprising carbon;
a plurality of metal nanoparticles, each of the nanoparticles comprising a coating of the dispersant; and
an organic solvent comprising oxygen nanobubbles, the solvent comprising oxygen at a supersaturated concentration which is at least five times an oxygen saturation concentration in the organic solvent;
wherein the dispersant, when heated to 150 degrees centigrade, comprises a fluidity less than gaseous carbon dioxide; and
wherein the organic solvent, when heated to 150 degrees centigrade, comprises a fluidity less than gaseous carbon dioxide.

13. A method of making metal nanoink, the method comprising:
(a) coating a plurality of metal nanoparticles with a dispersant to form a plurality of coated metal nanoparticles, the dispersant comprising carbon;
(b) mixing the plurality of coated metal nanoparticles with an organic solvent to form a mix; and (c) injecting oxygen nanobubbles into the mix to create a supersaturated concentration of oxygen which is at least five times an oxygen saturation concentration in the organic solvent;

wherein oxygen is present only as dissolved oxygen and oxygen nanobubbles.

14. The method of claim 13, wherein the dispersant, when heated to 150 degrees centigrade, comprises a fluidity less than gaseous carbon dioxide; and wherein the organic solvent, when heated to 150 degrees centigrade, comprises a fluidity less than gaseous carbon dioxide.

15. The method of claim 13, wherein step (b) is performed by mixing the plurality of coated metal nanoparticles into the organic solvent.

16. The method of claim 13, wherein step (b) comprising adjusting a viscosity of the mix.

17. The method of claim 16, wherein a viscosity of the mix is adjusted when the viscosity conforms to a shape of a predetermined ejection head.

18. The method of claim 13, wherein step (c) is performed for at least 10 hours.

19. The method of claim 13, wherein step (c) is performed using an injection nozzle held below a surface boundary of the mix.

20. The method of claim 13, wherein step (c) is performed by shearing oxygen bubbles.

21. The method of claim 20, wherein step (c) further includes detecting an oxygen concentration.

22. The method of claim 13, wherein after step (b) and prior to step (c) the mix is transferred to a container, wherein oxygen bubbles that are larger than nanobubbles can vent to an ambient environment.

* * * * *